(12) United States Patent
Yang et al.

(10) Patent No.: US 11,164,972 B2
(45) Date of Patent: **\*Nov. 2, 2021**

(54) METHOD FOR FORMING STRESSOR, SEMICONDUCTOR DEVICE HAVING STRESSOR, AND METHOD FOR FORMING THE SAME

(71) Applicant: TAIWAN SEMICONDUCTOR MANUFACTURING CO., LTD., Hsinchu (TW)

(72) Inventors: Che-Wei Yang, New Taipei (TW); Hao-Hsiung Lin, Taipei (TW); Samuel C. Pan, Hsinchu (TW)

(73) Assignees: TAIWAN SEMICONDUCTOR MANUFACTURING CO., LTD., Hsinchu (TW); NATIONAL TAIWAN UNIVERSITY, Taipei (TW)

(\*) Notice: Subject to any disclaimer, the term of this patent is extended or adjusted under 35 U.S.C. 154(b) by 0 days.

This patent is subject to a terminal disclaimer.

(21) Appl. No.: 16/725,525

(22) Filed: Dec. 23, 2019

(65) Prior Publication Data

US 2020/0135926 A1    Apr. 30, 2020

Related U.S. Application Data

(62) Division of application No. 15/454,118, filed on Mar. 9, 2017, now Pat. No. 10,516,050.

(Continued)

(51) Int. Cl.
*H01L 29/78* (2006.01)
*H01L 29/10* (2006.01)
(Continued)

(52) U.S. Cl.
CPC .... *H01L 29/7849* (2013.01); *H01L 21/02381* (2013.01); *H01L 21/02546* (2013.01); (Continued)

(58) Field of Classification Search
CPC ............. H01L 29/1054; H01L 29/7846; H01L 29/7848; H01L 29/7849; H01L 29/785
See application file for complete search history.

(56) References Cited

U.S. PATENT DOCUMENTS 5,132,755 A    7/1992   Ueno
6,362,082 B1   3/2002   Doyle et al.
(Continued)

FOREIGN PATENT DOCUMENTS

CN    103996709 A    8/2014

OTHER PUBLICATIONS

Office Action issued in corresponding Taiwanese Patent Application No. 10920190950, dated Feb. 27, 2020.
(Continued)

*Primary Examiner* — Mark V Prenty
(74) *Attorney, Agent, or Firm* — McDermott Will & Emery LLP

(57) ABSTRACT

A semiconductor device includes a semiconductor fin protruding from a substrate, a gate electrode over the semiconductor fin, a gate insulating layer between the semiconductor fin and the gate electrode, source and drain regions disposed on opposite sides of the semiconductor fin, a first stressor formed in a region between the source and drain regions. The first stressor including one material selected from the group consisting of He, Ne, and Ga.

17 Claims, 11 Drawing Sheets

Related U.S. Application Data

(60) Provisional application No. 62/368,669, filed on Jul. 29, 2016.

(51) Int. Cl.
| | | |
|---|---|---|
| *H01L 29/267* | (2006.01) | |
| *H01L 29/66* | (2006.01) | |
| *H01L 21/02* | (2006.01) | |
| *H01L 21/265* | (2006.01) | |
| *H01L 21/324* | (2006.01) | |
| *H01L 29/06* | (2006.01) | |
| *H01L 29/36* | (2006.01) | |

(52) U.S. Cl.
CPC .. *H01L 21/02603* (2013.01); *H01L 21/02639* (2013.01); *H01L 21/26506* (2013.01); *H01L 21/324* (2013.01); *H01L 29/0676* (2013.01); *H01L 29/1037* (2013.01); *H01L 29/1054* (2013.01); *H01L 29/267* (2013.01); *H01L 29/36* (2013.01); *H01L 29/66522* (2013.01); *H01L 29/66568* (2013.01); *H01L 29/66795* (2013.01); *H01L 29/785* (2013.01); *H01L 29/7842* (2013.01); *H01L 29/7843* (2013.01)

(56) References Cited

U.S. PATENT DOCUMENTS

| | | | |
|---|---|---|---|
| 6,740,913 | B2 | 5/2004 | Doyle et al. |
| 6,878,978 | B2 | 4/2005 | Dokumaci et al. |
| 6,887,751 | B2 | 5/2005 | Chidambarrao et al. |
| 8,154,051 | B2 | 4/2012 | Wang et al. |
| 8,288,217 | B2 | 10/2012 | Guo et al. |
| 8,361,868 | B2 | 1/2013 | Clifton |
| 8,482,069 | B2 | 7/2013 | Yamazaki et al. |
| 9,059,201 | B2 | 6/2015 | Clifton |
| 10,516,050 | B2 * | 12/2019 | Yang ............... H01L 29/7843 |
| 10,832,957 | B2 * | 11/2020 | Yang ............... H01L 29/66795 |
| 2002/0074598 | A1 | 6/2002 | Doyle et al. |
| 2004/0166624 | A1 | 8/2004 | Dokumaci et al. |
| 2005/0003604 | A1 | 1/2005 | Dokumaci et al. |
| 2005/0059201 | A1 | 3/2005 | Chidambarrao et al. |
| 2006/0166475 | A1 | 7/2006 | Mantl |
| 2006/0208342 | A1 | 9/2006 | Choi et al. |
| 2007/0117296 | A1 | 5/2007 | Giles et al. |
| 2008/0124858 | A1 | 5/2008 | Nguyen et al. |
| 2009/0267117 | A1 | 10/2009 | Teo et al. |
| 2010/0127353 | A1 | 5/2010 | Letertre et al. |
| 2012/0171832 | A1 | 7/2012 | Toh et al. |
| 2014/0361335 | A1 | 12/2014 | Flachowsky et al. |
| 2016/0020322 | A1 | 1/2016 | Bhattacharyya et al. |
| 2016/0204224 | A1 | 7/2016 | Fukui et al. |

OTHER PUBLICATIONS

Jacky Huang et al., "Impact of Source-Drain Sil-yCyStressors on the Silicon-on-Insulator NMOSFETs", Department of Electrical Engineering, National Chung Hsing University, Taichung Taiwan, ROC, 2 pgs.

Z. Mi et al., "ILL-V compound semiconductor nanostructures on silicon: Epitaxial growth, properties, and applications in light emitting diodes and lasers", Journal of Nanophotonics, vol. 3, Jan. 23, 2009, pp. 1-19.

S.W. Bedell et al., "Strain scaling for CMOS Materials Research Society", MRS Bulletin, pp. 131-137.

Non-final Office Action issued in related U.S. Appl. No. 15/454,118, dated Mar. 16, 2018.

Final Office Action issued in related U.S. Appl. No. 15/454,118, dated Aug. 31, 2018.

Non-final Office Action issued in related U.S. Appl. No. 15/454,118, dated Feb. 19, 2019.

Non-final Office Action issued in related U.S. Appl. No. 15/454,118, dated Jun. 6, 2019.

Notice of Allowance issued in related U.S. Appl. No. 15/454,118, dated Nov. 6, 2019.

* cited by examiner

METHOD FOR FORMING STRESSOR, SEMICONDUCTOR DEVICE HAVING STRESSOR, AND METHOD FOR FORMING THE SAME

PRIORITY CLAIM AND CROSS-REFERENCE

This application is Divisional of U.S. patent application Ser. No. 15/454,118 filed on Mar. 9, 2017, entitled "METHOD FOR FORMING STRESSOR, SEMICONDUCTOR DEVICE HAVING STRESSOR, AND METHOD FOR FORMING THE SAME", which claims priority to U.S. Provisional Application No. 62/368,669 filed Jul. 29, 2016, entitled "SEMICONDUCTOR DEVICE HAVING STRESSOR, METHOD FOR FORMING STRESSOR, AND METHOD FOR FORMING SEMICONDUCTOR DEVICE HAVING STRESSOR," the entire disclosure of the two applications are incorporated herein by reference.

TECHNICAL FIELD

The present disclosure relates generally to a method for forming a stressor, a semiconductor having a stressor, and a method for forming the same, and more particularly, to a method for forming a stressor by an ion beam, a semiconductor having a stressor formed by an ion beam, and a method for forming the same.

BACKGROUND

In semiconductor devices, strain engineering has been applied to improve electron/hole mobility.

A contemporary method for forming stressors inside a semiconductor material usually requires an ion implantation mask, which further requires a photolithography process, so as to control lateral locations of stressors to be formed. In such a method, individual, independent control of the stressors including the relative locations, depths, sizes, and doped concentrations thereof are not available, because the stressors are formed simultaneously by the same implantation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
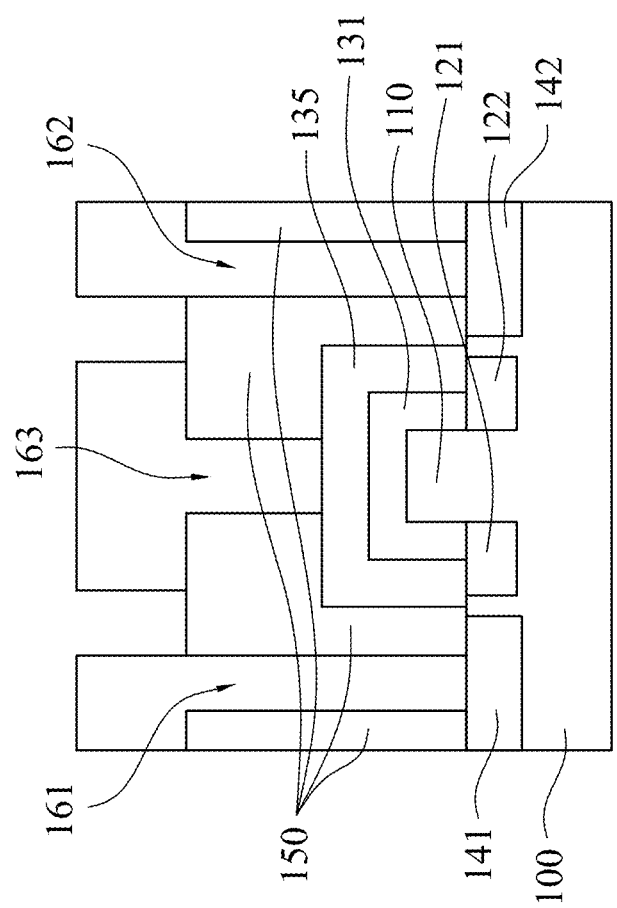
FIG. 1 is a schematic cross-sectional view of a strained channel transistor according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

In the entire disclosure, "about" used to describe a parameter means that design error/margin, manufacturing error/margin, measurement error etc. are considered to define the parameter. Such a description should be recognizable to one of ordinary skill in the art.

FIG. 1 is a schematic cross-sectional view of a strained channel transistor according to embodiments of the present disclosure.

Referring to FIG. 1, a strained channel transistor 10 is formed in a substrate 100 which can be one of a silicon (Si) substrate, a germanium (Ge) substrate, a silicon germanium (SiGe) substrate, a gallium arsenide (GaAs) substrate, an indium gallium arsenide (InGaAs) substrate, and a silicon-on-insulator (SOI) substrate, although the present discourse is not limited thereto. The strained channel transistor 10 includes a channel region 110 made of a fin structure protruding from the substrate 10, and a gate structure includes a gate insulating layer 131 covering side surfaces and a top surface connecting the side surfaces of the channel region 110 and a gate electrode layer 135 covering side surfaces of the gate insulating layer 131 and a top surface connecting the side surfaces of the gate insulating layer 131. The gate insulating layer 131 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$), other suitable high-k dielectric materials, and/or combinations thereof. The material for the gate electrode layer 135 may be poly-Si, poly-Si with silicide, Al, Cu, W, Ti, Ta, TiN, TaN, TiW, WN, TiAl, TiAlN, TaC, TaCN and TiSiN, or any other suitable conductive materials.

In some embodiments, the channel region 110 is a portion of the substrate 100 by removing portions of the substrate 100 on opposite sides of the channel region 110 such that the remaining portion of the substrate 100 after the removal process becomes the fin structure protruding from the substrate 100. In a case in which the substrate 100 is an SOI substrate, the channel region 110 is formed of a device layer of the SOI substrate by removing portions of the device layer. Alternatively, the channel region 110 is made of an epitaxially grown semiconductor layer including, but not limited to, a crystalline silicon layer or a crystalline silicon germanium layer, on the substrate 100. In this case, one or more buffer layers (not shown) may be optionally grown on the substrate 100 prior to forming the epitaxially grown semiconductor layer so as to alleviate interface defects caused, for example, by a lattice mismatch. If necessary, portions of the epitaxially grown semiconductor layer can be removed to form the channel region 110.

Referring to FIG. 1, the strained channel transistor 10 includes source and drain regions 141 and 142 made, for example, from portions of the substrate 100 heavily doped with dopants or impurities.

The strained channel transistor 10 further includes a first stressor 121 which is an extension portion between the source region 141 and the channel region 110. The first stressor 121 may not be directly below the channel region 110 in a thickness direction of the substrate 100. In some embodiments, the first stressor 121 contains dopants or impurities that are not contained in the region immediately adjacent to the first stressor 121. For example, the first stressor 121 contains the dopants or impurities that are not contained in a region immediately below the channel region 110 and/or the channel region 110. In some embodiments, the first stressor 121 contains dopants or impurities that may be contained in the channel region 110 and/or the source region 141 but with a much lower concentration than the concentration of the dopants or impurities contained in the first stressor 121.

According to some embodiments, the dopants or impurities contained in the first stressor 121 are one or more elements from the group consisting of helium (He), neon (Ne), and gallium (Ga), which are implanted, for example, by focused ion beam (FIB). In some embodiments, the channel region 110 and/or the source region 141 are not doped with any dopants or impurities such as He, Ne, and Ga contained in the first stressor 121.

The lattice constant of the first stressor 121 is increased, compared to the lattice constant of the same region as the first stressor 121 prior to implanting the dopants or impurities thereto. In a case in which the region corresponding to the first stressor 121, the channel region 110, and the region immediately below the channel region 110 have the same lattice constant prior to implanting the dopants or impurities, since the first stressor 121 contains the dopants or impurities that are not doped in the channel region 110, the lattice constant of the first stressor 121 is increased compared to those of the channel region 110 and the region immediately below the channel region 110.

Still referring to FIG. 1, the strained channel transistor 10 further includes a second stressor 122 disposed between the channel region 110 and the drain region 142. A description of the second stressor 122 and the drain region 142 can be referred to the above description of the first stressor 121 and the source region 141 and therefore will be omitted to avoid redundancy.

As described above, the lattice constant of the first stressor 121 and the lattice constant of the second stressor 122 are increased compared to that of a region immediately adjacent thereto, for example, the region immediately below the channel region 110 and/or the channel region 110. That is, the lattice of the first and second stressors 121 and 122 swells, inducing stress in the transistor 10, in particular in the channel region 110. Thus, the channel region 110 undergoes a compressive stress generated by the first and second stressors 121 and 122 having a relatively greater lattice constant, and in this case, the channel region 110 is a strained channel region.

The concentration of the dopants or impurities contained in the first and second stressors 121 and 122 is from about $10^{10}/cm^3$ to about $10^{20}/cm^3$ in some embodiments, or is from about $10^{15}/cm^3$ to about $10^{20}/cm^3$ in other embodiments. In a case in which the channel region 110 is formed in an N-type well and the strained channel transistor 10 is a P-type transistor, if a range of the doped concentration from about $10^{10}/cm^3$ to about $10^{20}/cm^3$ or a range of the doped concentration from about $10^{15}/cm^3$ to about $10^{20}/cm^3$ is satisfied, a mobility of holes in the channel region 110 can be increased to allow the strained channel transistor 10 to operate in a relatively lower voltage, requiring less power, but with relatively higher current, and in the meantime, other effects that may deteriorate the performance of the transistor can be suppressed. Accordingly, such a strained channel transistor 10 can operate in a relatively higher frequency with less power compared to a transistor having the same structure as the strained channel transistor 10 except that no stressors are formed in the regions corresponding to the first and second stressors 121 and 122.

According to some embodiments, the second stressor 122, positioned at one side of the channel region 110 opposite to the first stressor 121, contains the same dopants or concentration as those contained in the first stressor 121. The doped concentrations of the first and second stressors 121 and 122 can be the same, when a variation due to manufacturing margins/errors in an implantation process is neglected. In this case, the first and second stressors 121 and 122 are positioned symmetrically in relation to the channel region 110, although the present disclosure is not limited thereto.

According to other embodiments, the second stressor 122 can be positioned at one side of the channel region 110 opposite to the first stressor 121, have dopants or impurities different from those contained in the first stressor 121, and/or have a concentration different from that of the first stressor 121. In this case, the first and second stressors 121 and 122 may be positioned unsymmetrically with respect to the channel region 110.

In some embodiments, an entire region of each of the first and second stressors 121 and 122 has a uniform lattice constant. In other embodiments, the lattice constant in a sub-region of the first stressor 121 or the second stressor 122 becomes smaller when a distance from the sub-region to the center thereof increases.

In a case in which FIB is implemented to implant the dopants or impurities to form the first and second stressors 121 and 122, the first and second stressors 121 and 122 of the strained channel transistor 10 can be formed one after another, and the locations, sizes, types of dopants or impurities, and/or concentrations thereof thus can be controlled independently.

Still referring to FIG. 1, the strained channel transistor 10 further includes a source contact 161 formed over the source region 141 and electrically connected thereto, a drain contact 162 formed over the drain region 141 and electrically connected thereto, and a gate contact 163 formed over the gate electrode 135 and electrically connected thereto. The source contact 161, the drain contact 162, and the gate contact 163 each penetrate through a dielectric layer 150 disposed over the substrate 100 and are electrically isolated from each other by the dielectric layer 150.

Although FIG. 1 shows that a configuration in which the channel region 110 made of a fin structure protrudes from the substrate 100 and the source and drain regions 141 and 142, together with the first and second stressors 121 and 122, are embedded in the substrate 100, it should be appreciated that such a configuration is an example for description and the present discourse is not limited thereto. Alternatively, the source and drain regions 141 and 142, together with the first and second stressors 121 and 122 and the channel region 110, can be modified to be formed in the same fin structure protruding from the substrate 100. According to other embodiments, the upper surface of the channel region 110 may be positioned to be flush to the other portion of the substrate 100, and in this case, the channel region 110 can be modified to not protrude from the substrate 100, similar to the source and drain regions 141 and 142 and the first and second stressors 121 and 122.

Figure 2:
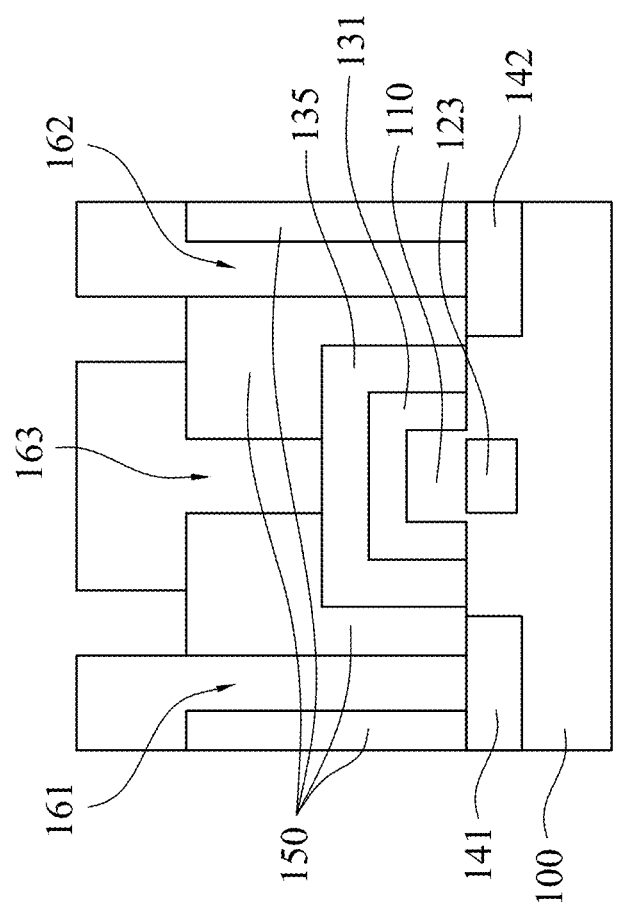
FIG. 2 is a schematic cross-sectional view of a strained channel transistor according to embodiments of the present disclosure.

FIG. 2 is a schematic cross-sectional view of a strained channel transistor according to embodiments of the present disclosure.

Referring to FIG. 2, a strained channel transistor 20 according to embodiments of the present disclosure has a structure substantially the same as that of the aforementioned strained channel transistor 10 shown in FIG. 1, except that in the strained channel transistor 20, a stressor 123 is disposed below a channel region 110 and overlaps with the channel region 110 in a thickness direction of a substrate 100. In addition, in a case in which the strained channel transistor 10 is one type of a P-type transistor and an N-type transistor, the strained channel transistor 20 is configured to be the other type. One of ordinary skill in the art would recognize that the strained channel transistors 10 and 20 can be integrated into a same chip.

It should be appreciated that the aforementioned modifications to the strained channel transistor 10 are also applicable to the strained channel transistor 20 shown in FIG. 2. A description of those elements having the same reference numbers as those in FIG. 1 can be referred to the above description with reference to FIG. 1 and therefore will be omitted to avoid redundancy.

As shown in FIG. 2, the strained channel transistor 20 only includes the single contiguously formed stressor 123. Description of the types of dopants or impurities for forming the stressor 123, ranges of the dopants or impurities, and a process for forming the stressor 123 can be referred to the description of the first stressor 121 and/or the second stressor 122 with reference to FIG. 1, and will be omitted here.

The lattice constant of the stressor 123 is increased compared to that of the channel region 110 and compared to the same region as the stressor 123 prior to the implantation. That is, the lattice of the stressor swells, inducing stress in the transistor 20, in particular in the region immediately adjacent thereto including the channel region 110. The channel region 110 therefore undergoes a tensile stress generated by the stressor 123. The stressor 123 has a relatively greater lattice constant than the region immediately adjacent thereto including the channel region 110, and thus, the channel region 110 is a strained channel region.

In a case in which the channel region 110 is formed in a P-type well and the strained channel transistor 20 is an N-type transistor, if the aforementioned ranges of doped concentration are satisfied, in particularly the range from about $10^{15}/cm^3$ to about $10^{20}/cm^3$ is satisfied, a mobility of electrons in the channel region 110 can be increased to allow the strained channel transistor 20 to operate in a relatively lower voltage, requiring less power, but with relatively higher current, while other effects that may deteriorate the performance of the transistor can be suppressed. Such a strained channel transistor 20 can operate in a relatively higher frequency with less power compared to a transistor having the same structure as the strained channel transistor 20 except that no stressor is formed.

Although not shown, in a case in which two or more strained channel transistors 20 are formed in a same chip made from the substrate 100, when FIB is implemented to implant the dopants or impurities to form the two or more strained channel transistors 20, the stressors 123 of the two or more strained channel transistors 20 can be formed one after another, and the locations and sizes of the stressors 123 in relation to the respective channel regions, types of dopants or impurities, and/or concentrations thereof can be controlled independently according to design particulars.

Figure 3:
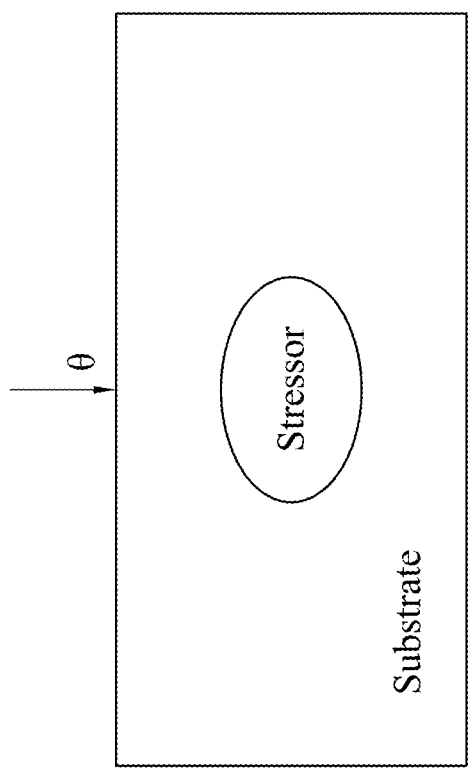
FIG. 3 is a conceptual view of implanting dopants or impurities into a region of interest in a substrate according to embodiments of the present disclosure.

A method for implanting dopants or impurities into a region of interest, for example, a region corresponding to either the first stressor 121 or the second stressor 122 shown in FIG. 1 or the stressor 123 shown in FIG. 2, in a substrate, will be described with reference to FIG. 3. FIG. 3 shows a conceptual view of implanting dopants or impurities into a region of interest in a substrate according to embodiments of the present disclosure.

Referring to FIG. 3, an ion beam is directly applied to form a stressor which can be in a nano-scale in a semiconductor substrate such as silicon (Si) substrate, a germanium (Ge) substrate, a silicon germanium (SiGe) substrate, a gallium arsenide (GaAs) substrate, an indium gallium arsenide (InGaAs) substrate, and a silicon-on-insulator (SOI) substrate. The semiconductor substrate can be any other substrates that are suitable to manufacture semiconductor devices. The stressor formed by implantation via an ion beam can be used to adjust the lattice constants of regions adjacent to the regions where the stressors are intended to implant.

In some embodiments, the stressor formed, for example by an ion beam, can be shrunk to sub 10-nanometer. In this manner, the stressor is a nanostressor. The location of the stressor can be precisely controlled and formed directly due to an extremely small size of an ion beam. In some embodiments, no ion implantation mask is required to form stressors by an ion beam. The direct writing of a stressor, for example, by an ion beam instead of other fabrication processes including photography, can be relatively easier to manufacture a stressor at a desired location with a desired doped concentration at a relatively lower manufacturing cost. In other embodiments, ion implantation mask can be formed to determine lateral locations of the stressors.

In some embodiments, ions, such as He, Ne, and Ga, are implanted to a specific region by an ion beam to form a stressor. In other embodiments, boron (B) or phosphorus (P) beam, rather than He, Ne, or Ga beam, can be used for directly forming a stressor. In some embodiments, the ion beam is a focused ion beam (FIB).

A thermal annealing process can be performed after ion writing (or direct ion implantation) and thus, damage and defects caused by ion implantation can be annihilated. The thermal annealing process can be rapid thermal annealing (RTA), microwave annealing (MWA), laser anneal, etc. In some embodiments, the annealing temperature can be from about 50° C. to about 1300° C. In other embodiments, the annealing temperature is from about 600° C. to about 800° C. The ramp rate can be about 0.1° C./s to about 1000° C./s in some embodiments. The duration of thermal annealing is from about 1 second to about 24 hours in some embodiments.

The stressor is a region, a lattice of which swells by ion implantation followed by an optional annealing process. Ion beam writing/lithography can not only control the size of ion beam, but also the dosage of ions so as to adjust the amount of stress to the adjacent regions. The dosage, size, shape, depth, location, etc. of the stressor can be controlled, for example, by an acceleration voltage of ions, current of ions, an incident angle of ions, etc. In some embodiments, the acceleration voltage of ions can be about 0.1 KeV to about 1000 KeV. In other embodiments, the acceleration voltage of ions is about 1 KeV to about 50 KeV. In some embodiments, the current of ions is from about 1 fA to about 1 mA. In other embodiments, the current of ions is from about 1 pA to about 1 µA. In some embodiments, the incident angle of ions, an angle θ between incident ion current and a normal of the substrate, is from about 0.01° to about 179.99°. In other embodiments, the incident angle θ of ion current is from about 45° to about 135°.

Figure 4:
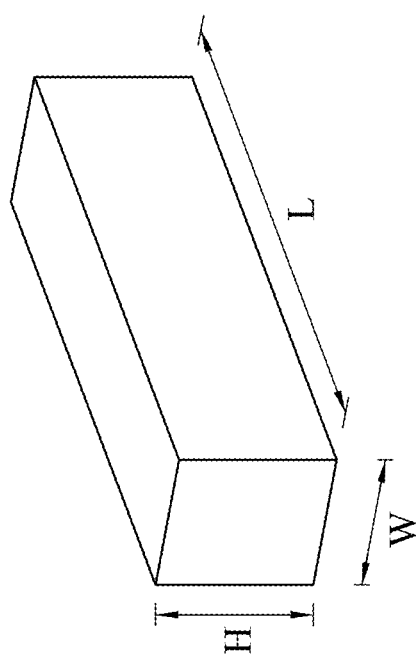
FIG. 4 is an exemplary structure of a stressor manufactured by a method according to embodiments of the present disclosure and dimensions of the exemplary structure.

Referring to FIG. 4, which shows an exemplary structure of a stressor manufactured by a method according to embodiments of the present disclosure and dimensions of the exemplary structure, a shape of a stressor can be a rectangular cuboid. Each of a width W, a length L, and a height H of the rectangular cuboid ranges from about 1 nm to about $10^5$ nm and a ratio between two of the width W, length L, and height H ranges from about $10^{-5}$ to about $10^5$, although the present disclosure is not limited thereto.

A rectangular-cuboid-shaped stressor shown in FIG. 4 is merely an example; the stressor according to embodiments of the present disclosure, however, can have other shapes including, but not limited to, a cubic shape, an ovoid shape, a tetrahedron shape, a hexagonal prism, etc. In some embodiments, any other shape can be obtained by direct writing via ion beam.

FIGS. 5A to 5G show process steps to manufacture the strained channel transistor shown in FIG. 1 according to embodiments of the present disclosure.

Figure 5A:
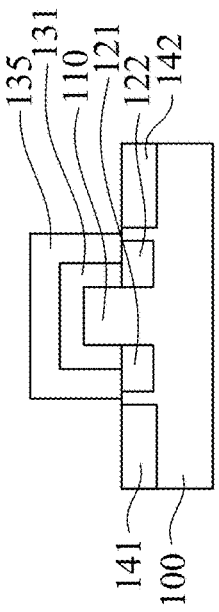
FIGS. 5A to 5G show process steps to manufacture the strained channel transistor shown in FIG. 1, according to embodiments of the present disclosure.

Referring to FIG. 5A, a substrate 100, which can be one of a silicon (Si) substrate, a germanium (Ge) substrate, a silicon germanium (SiGe) substrate, a gallium arsenide (GaAs) substrate, an indium gallium arsenide (InGaAs) substrate, a silicon-on-insulator (SOI) substrate, and any other semiconductor substrate, is prepared.

Figure 5B:
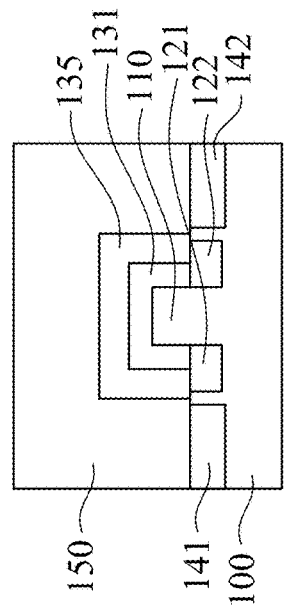

As shown in FIG. 5B, a fin structure, a portion of which becomes a channel region 110, is formed on the substrate 100 such that the fin structure protrudes from the substrate 100. The fin structure can be formed, for example, by a portion of the substrate 100 when portions of the substrate 100 on opposite sides of the fin structure are removed by a photolithography process followed by a dry etching process or a wet etching process. Thus, the remained top portion of the substrate 100 becomes the fin structure.

In a case in which the substrate 100 is an SOI substrate, the fin structure can be formed of a device layer of SOI substrate by removing portions of the device layer.

Alternatively, the channel region 110 can be formed by epitaxially growing a semiconductor layer including, but not limited to, a crystalline silicon layer or a crystalline silicon germanium layer, on the substrate 100 followed by a photolithography process and a dry etching process or a wet etching process. Accordingly, the remaining portion of the epitaxially grown layer becomes the fin structure on the substrate 100. Optionally, one or more buffer layers (not shown) may be grown on the substrate 100 prior to epitaxially growing the semiconductor layer so as to alleviate interface defects caused, for example, by lattice mismatch between the epitaxially grown semiconductor layer and the substrate 100.

Figure 5C:
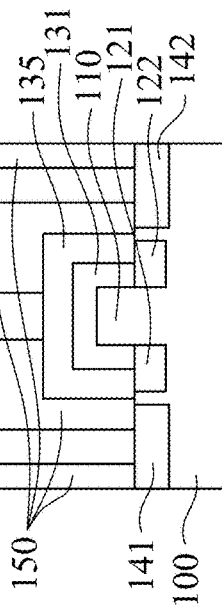

Referring to FIG. 5C, first and second stressors 121 and 122 are formed by implanting one or more elements selected from the group consisting of helium (He), neon (Ne), and gallium (Ga) via, for example, an ion beam so as to adjust lattice constants of the regions corresponding to the first and second stressors 121 and 122 in relation to the regions immediately adjacent thereto and the channel region 110. In this case, the channel region 110 undergoes a compressive stress generated by the first and second stressors 121 and 122 having a relatively greater lattice constant than that of the channel region 110. In some embodiments, the ion beam can be a focused ion beam (FIB). In other embodiments, a boron (B) or phosphorus (P) beam, rather than a He, Ne, or Ga beam, can be used to form the first and second stressors 121 and 122.

In a case in which an ion beam or a focused ion beam is used to form the first and second stressors 121 and 122, the first and second stressors 121 and 122 can be formed one after another, i.e., not simultaneously. The size, for example, a diameter when the shape is a sphere or a side length when the shape is a cubic, of the first and second stressors can be shrunk to sub 10-nanometer, depending on design particulars. The size and the location of the first and second stressors 121 and 122 can be precisely controlled due to extremely small size of the ion beam. In some embodiments, no ion implantation mask is required to directly form the first and second stressors 121 and 122 by the ion beam. The direct writing process by the ion beam instead of other fabrication processes including photography, can be easier to manufacture a stressor at a desired location with a desired doped concentration at a relatively lower manufacturing cost.

In other embodiments, ion implantation mask can be optionally formed to determine lateral locations of the stressors.

The dosage, size, shape, depth, location, etc. of the first and second stressors 121 and 122 can be controlled, for example, by an acceleration voltage of ions, current of ions, an incident angle of ions, etc. In some embodiments, the acceleration voltage of ion can be about 0.1 KeV to about 1000 KeV. In other embodiments, the acceleration voltage of ions is about 1 KeV to about 50 KeV. In some embodiments, the current of ion is from about 1 fA to about 1 mA. In other embodiments, the current of ions is from about 1 pA to about 1 µA. In some embodiments, the incident angle of ions, an angle θ between incident ion current and a normal of the substrate, is from about 0.01° to about 179.99°. In other embodiments, the incident angle θ of ion current is from about 45° to about 135°.

After implantation, a thermal annealing process can be optionally performed and thus, damage and defects caused by ion implantation can be annihilated. The thermal annealing process can be a rapid thermal annealing (RTA), microwave annealing (MWA), laser anneal, etc. In some embodiments, the annealing temperature can be from about 50° C. to about 1300° C. In other embodiments, the annealing temperature is from about 600° C. to about 800° C. The ramp rate can be about 0.1° C./s to about 1000° C./s in some embodiments. The duration of thermal annealing is from about 1 second to about 24 hours in some embodiments.

Figure 5D:
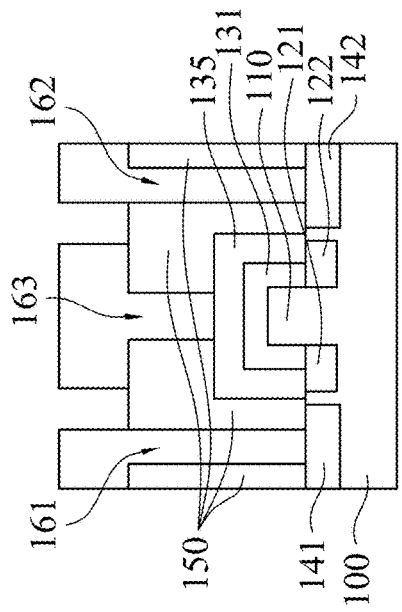
Figure 5E:
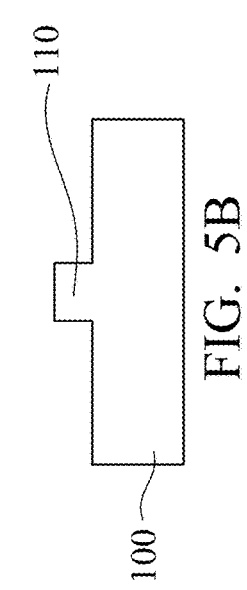

Referring to FIG. 5D, a gate structure including a gate insulating layer 131 and a gate electrode 135 is formed to cover the channel region 110 including side surfaces thereof and a top surface thereof connecting the side surfaces.

Thereafter, source and drain regions 141 and 142 are formed by implantation, which can be another technique other than the ion beam or the focused ion beam used to form the first and second stressors 121 and 122. Before the implantation process for forming the source and drain regions 141 and 142, an implantation mask (not shown) can be formed first to define the locations of the source and drain regions 141 and 142. Ions in the process shown in FIG. 5E may be applied to the entire surface of the substrate 100 but selectively implanted in the regions, defined by the implantation mask (not shown) corresponding to the source and drain regions, to form the source and drain regions 141 and 142. In this regard, the source and drain regions 141 and 142, unlike the first and second stressors, are formed simultaneously.

Figure 5F:
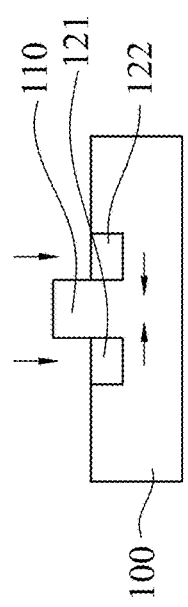

Thereafter, as shown in FIG. 5F, one or more interlayer dielectric (ILD) layers 150 are formed to cover the surface of the substrate 100 and the surface of the structure including the gate electrode layer 135 and the source and drain regions 141 and 142.

Figure 5G:
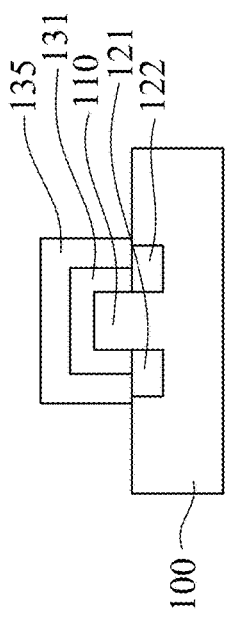

Then, as shown in FIG. 5G, a source contact 161, a drain contact 162, and a gate contact 163, each penetrating through the one or more interlayer dielectric layers 150, are formed to electrically connect to the source region 141, the drain region 142, and the gate electrode layer 135, respectively. Accordingly, the strain channel transistor 10 shown in FIG. 1 is formed.

Figure 6:
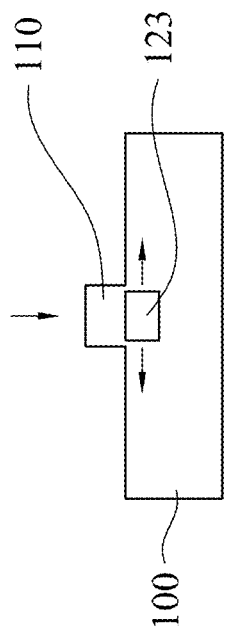
FIG. 6 shows a process to manufacture the strained channel transistor shown in FIG. 2, according to embodiments of the present disclosure.

FIG. 6 shows a process to manufacture the strained channel transistor shown in FIG. 2 according to embodiments of the present disclosure.

To avoid redundancy, FIG. 6 only shows an implantation by an ion beam or a focused ion beam to make a stressor and the remaining processes can be referred to the description with reference to FIGS. 5A, 5B, and 5D to 5G.

Referring to FIG. 6, a stressor 123 can be formed in a similar manner as the first and second stressors shown in FIG. 5C. The stressor 123 has a relatively greater lattice constant than the region immediately adjacent thereto including the channel region 110. Accordingly, a channel region 110 undergoes a tensile stress generated by the stressor 123 below the channel region 110 in a thickness direction of a substrate 100. Other description can be referred to that with reference to FIG. 5C and will be omitted to avoid redundancy.

By the process shown in FIG. 6, together with those shown in FIGS. 5A, 5B, and 5D to 5G, the strained channel transistor 20 shown in FIG. 2 is formed.

As described above, the process for manufacturing a stressor according to embodiments of the present disclosure shown in FIG. 3 can be implemented to manufacture a semiconductor chip including strained channel transistors. The present disclosure is not limited thereto. Hereinafter, a method including the process for manufacturing a stressor will be described with reference to FIGS. 7A to 7D to grow a semiconductor nanowire (NW) according to embodiments of the present disclosure.

Figure 7A:
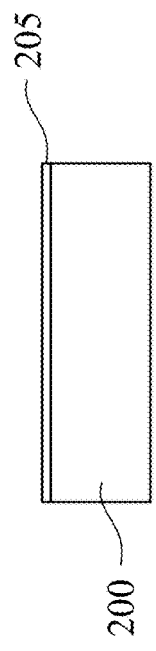
FIGS. 7A to 7D show process steps to manufacture a semiconductor nanowire (NW) according to embodiments of the present disclosure.

First, as shown in FIG. 7A, a hard masking layer 205 such as an oxide layer is formed on a semiconductor substrate 200. The semiconductor substrate 200 can be a silicon (111) substrate and the hard masking layer 205 can be a silicon oxide layer formed by thermal oxidation, although the present disclosure should not limited thereto. In a case the hard masking layer 205 is a silicon oxide layer, the thickness of the silicon oxide layer can be from 10 nm to 50 nm.

Figure 7B:
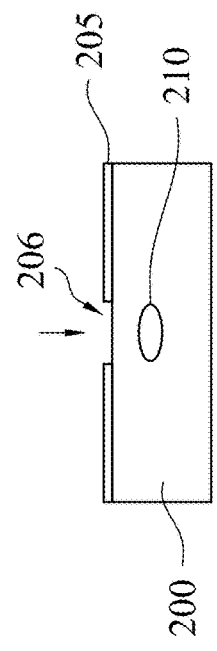

Thereafter, as shown in FIG. 7B, the hard masking layer 205 is patterned by ion beam milling/writing or focused ion beam (FIB) milling/writing. That is, ions or dopants/impurities are implanted into the semiconductor substrate 200 such that a stressor 210 is formed inside the substrate 200 where the ions or dopants/impurities settle, similar to the process shown in FIG. 5C or FIG. 6.

An accelerating voltage of about 0.1 KeV to about 1000 KeV or about 1 KeV to about 50 KeV can be used to generate ion current. The ion beam milling can be configured to have a spot mode in which ions bombard at a single point or a circle mode in which ions bombard in an area defined by a circle. A spot size of the focused ion beam (FIB) for the spot mode and/or the circle mode is from about 0.5 nm to about 10 nm in some embodiments. The exposure dosage for the circle mode can be from 5 nC/µm$^2$ to 25 nC/µm$^2$ and the exposure dosage for the spot mode can be from 1.5 pC to 8 pC in some embodiments. The formation of the stressor 210 having, for example, an oval-shaped ball under the opening 206 simultaneously accompanies the forming of an opening 206 in the hard masking layer 205. In some embodiments, ions are selected from the group consisting of He, Ne, and Ga.

Optionally, a thermal annealing process can be performed after ion writing, damage and defects caused by ion implantation can be annihilated. The thermal annealing process can be rapid thermal annealing (RTA), microwave annealing (MWA), laser anneal, etc. In some embodiments, the annealing temperature can be from about 50° C. to about 1300° C. In other embodiments, the annealing temperature is from about 600° C. to about 800° C. The ramp rate can be about 0.1° C./s to about 1000° C./s in some embodiments. The duration of thermal annealing is from about 1 second to about 24 hours in some embodiments.

Figure 7C:
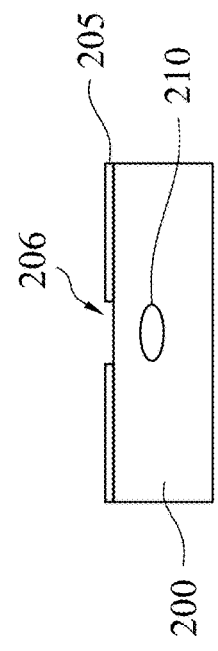

To ensure effective growth of a semiconductor nanowire, a surface treatment process, such as drying etching or wet etching to remove the residue of the hard masking layer material in the region bombarded by the ion beam, can be optionally performed with reference to FIG. 7C. In a case in which the hard masking layer 205 is a silicon oxide layer formed by thermal oxidizing the substrate 200 formed of silicon, the residue of silicon oxide in the portion bombarded by the ion beam can be removed by dipping in a dilute HF solution.

Figure 7D:
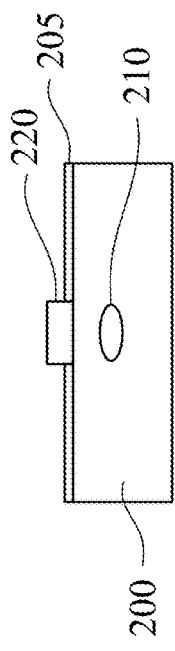

Referring to FIG. 7D, a semiconductor nanowire 220 is grown from the exposed portion of the substrate 200 by, for example, molecular beam epitaxy (MBE), although the present disclosure is not limited thereto. In a case in which the substrate 200 is a silicon (111) substrate, the hard masking layer 205 is a silicon oxide layer, and He ions are implanted by a focused ion beam to form the stressor 210 in the substrate 200, an InAs nanowire 220 can be grown from the exposed portion of the substrate 200. In a case the silicon oxide layer is completed removed at the region bombarded by the He ion beam and/or a dipping process in the diluted HF solution, the InAs nanowire can be directly formed on the exposed silicon substrate 200. Indium beam and $As_2$ beam for forming the InAs nanowire can come from effusion cells. The growth temperature can be from 400° C. to 600° C. In other embodiments, a GaAs nanowire can be formed in a similar manner as the InAs nanowire. The range of the growth temperature of the GaAs nanowire can be from about 400° C. to about 700° C. in some embodiments.

Figure 8A:
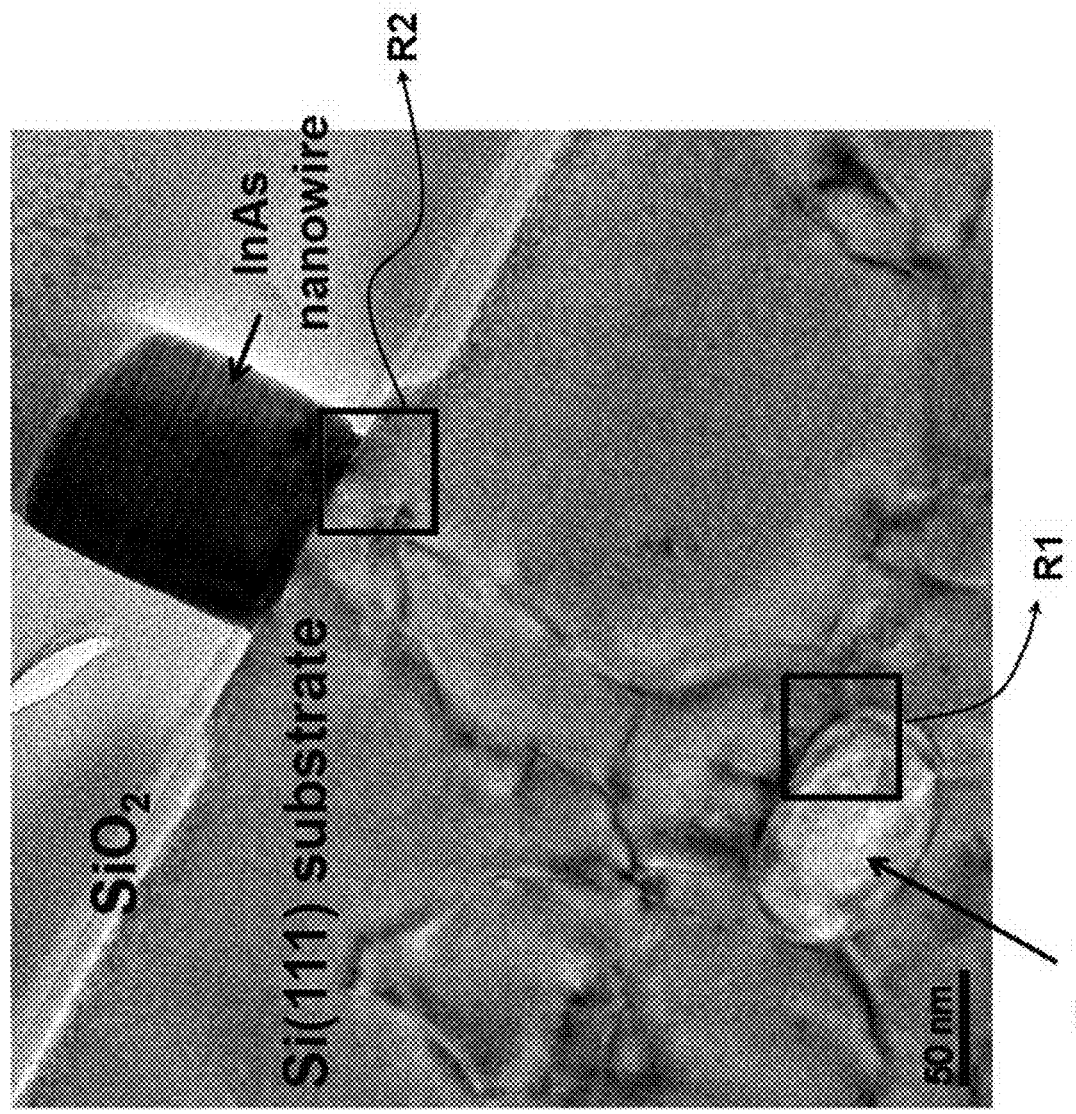
FIG. 8A is a transmission electron microscopy (TEM) image of an InAs nanowire formed on a silicon (111) substrate having a helium stressor embedded therein.
Figure 8B:
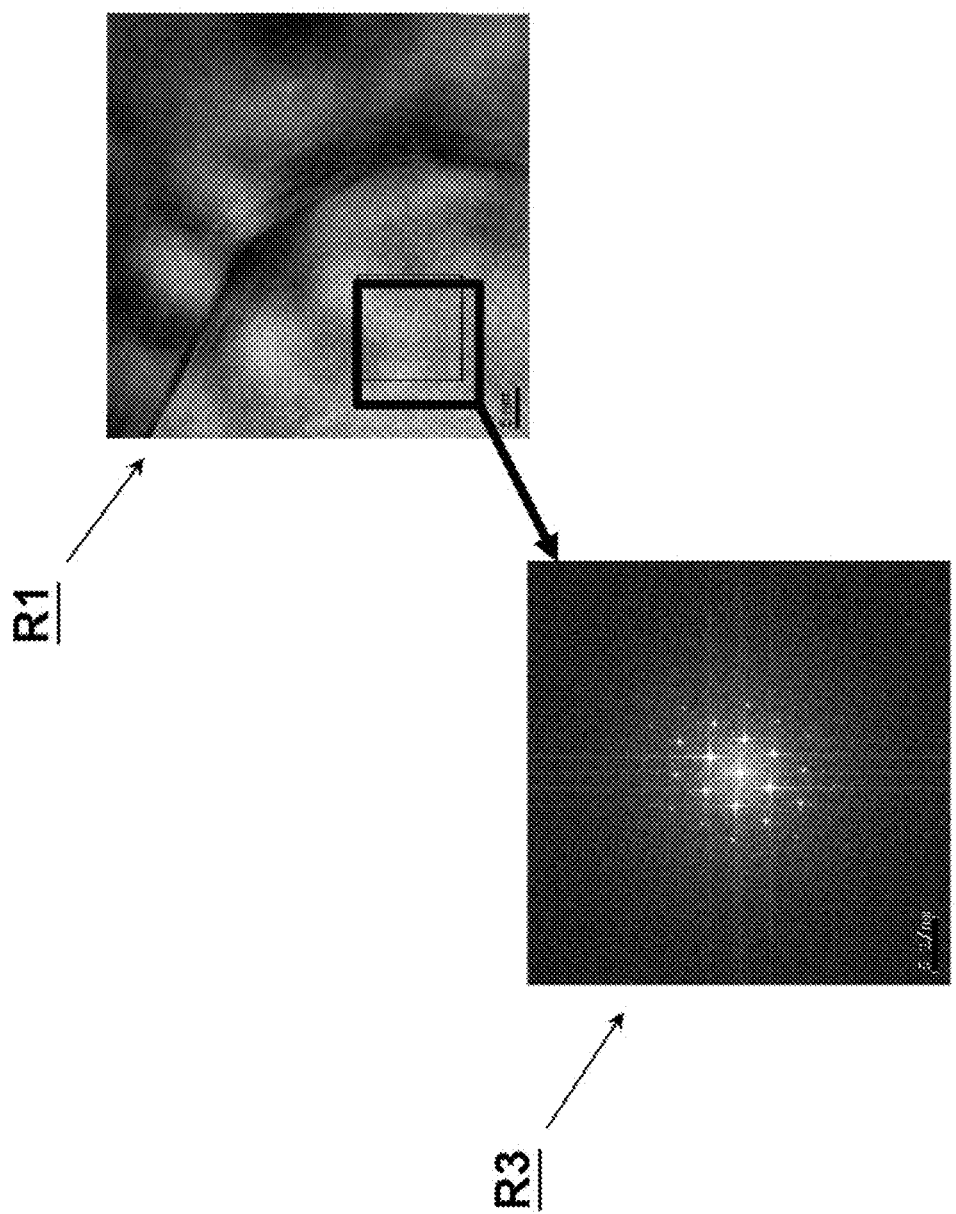
FIGS. 8B and 8C respectively show enlarged TEM images of regions R1 and R2 in FIG. 8A and transmission electron diffraction patterns of subregion R3 of region R1 and subregion R4 of region R2.
Figure 8C:
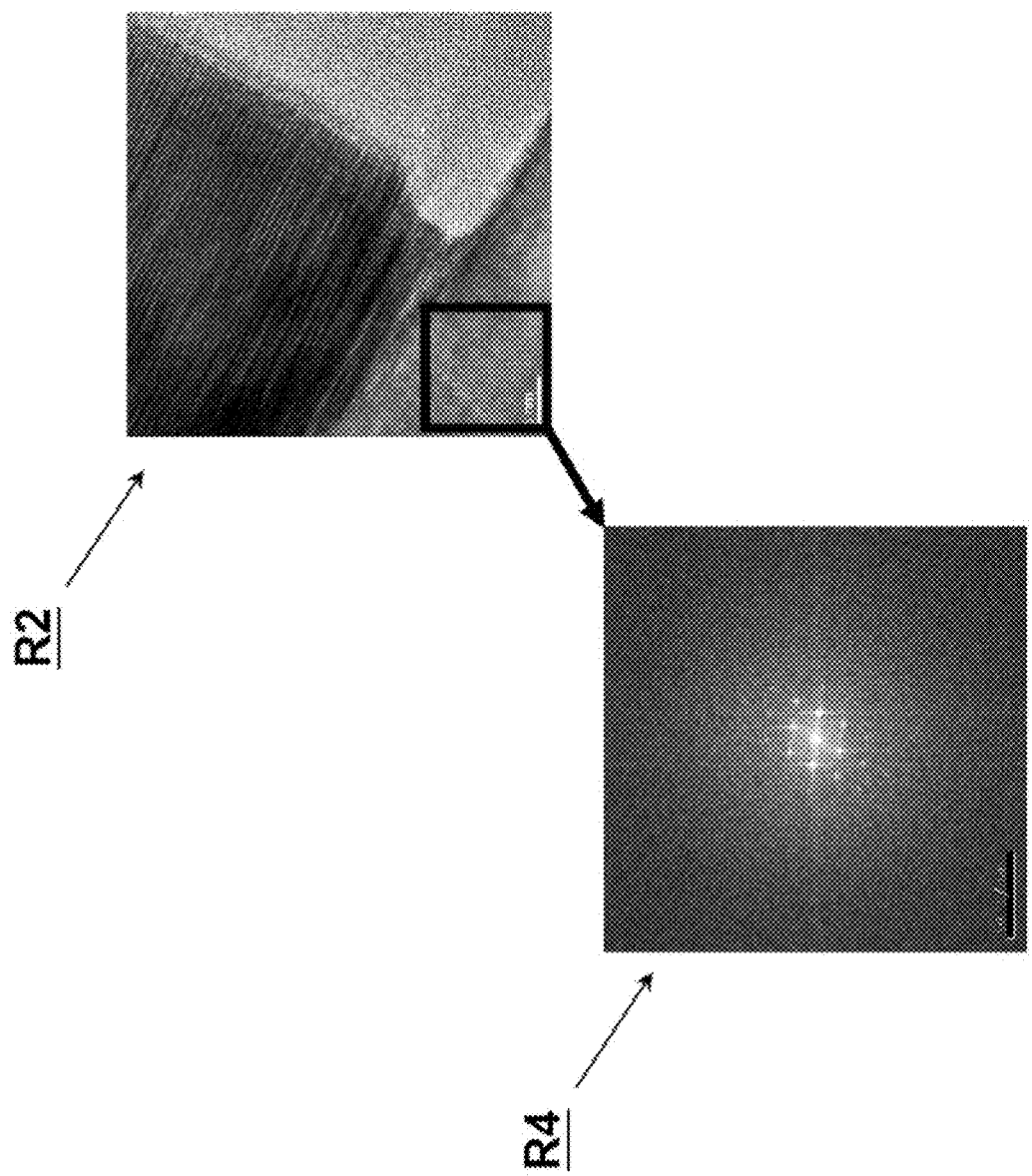

Due to the stressor 210 in the substrate 200, the lattice constant in the region of the stressor 210 increases, causing the lattice constant of the region adjacent thereto to increase slightly, as evidenced by FIG. 8A which shows a transmission electron microscopy (TEM) image of an InAs nanowire formed on a silicon (111) substrate having a He stressor embedded therein and FIGS. 8B and 8C which respectively show enlarged TEM images of regions R1 and R2 in FIG. 8A and transmission electron diffraction patterns of subregion R3 of regions R1 and subregion R4 of R2. The transmission electron diffraction pattern of subregion R3 shows subregion R3 having a lattice constant of 5.546 Å, and the transmission electron diffraction pattern of subregion R4 shows subregion R4 having a lattice constant increased from 5.431 Å, a lattice constant of relaxed silicon, to 5.517 Å. That is, the lattice mismatch at the interface between the silicon (111) substrate and the InAs nanowire grown thereon can be reduced by forming the He stressor in the silicon (111) substrate so as to promote formation of the vertically grown InAs nanowire and improve a yield thereof.

Figure 9:
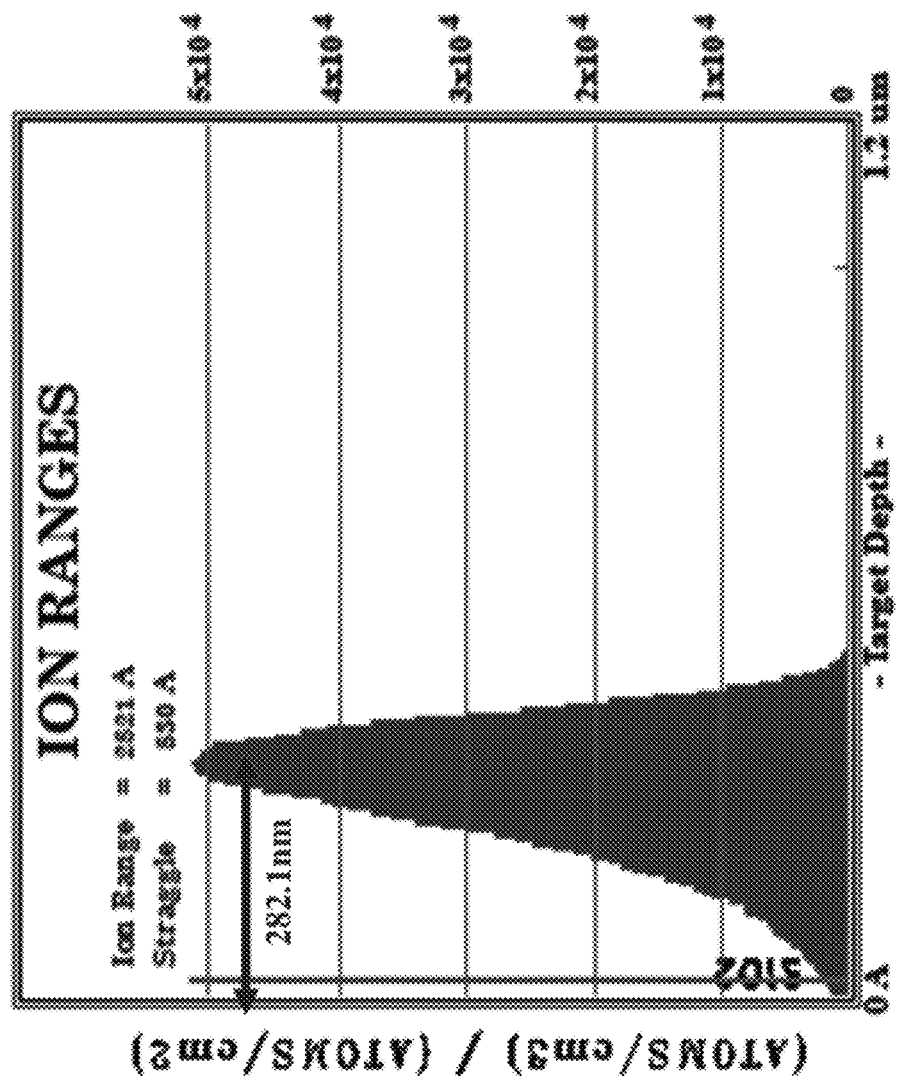
FIG. 9 shows a simulated curve showing that depth and size of a stressor are controllable by an acceleration voltage and current of an ion beam.

FIG. 9 shows a simulated curve showing that depth and size of a stressor are controllable by an acceleration voltage and current of an ion beam. As shown in FIG. 9, when He ions are accelerated by an accelerating voltage of 30 KeV to bombard a $SiO_2$/Si substrate, the depth of the He stressor is 2821 Å and the straggle of the He ion distribution is 880 Å. That is, the simulation can be used to obtain the desired voltage and/or current of He ion beam to be used to form a He stressor having certain depth and size so as to meet design particulars. Here, although the He ion beam and the $SiO_2$/Si substrate are used as an example, one of ordinary skill in the art would appreciate that this scheme can also be used to form other types of stressors in other types of substrates.

According to some aspects of the present disclosure, ion beam or focused ion beam, selected from the group consisting of He, Ne, and Ga, can be directly and precisely applied to a substrate to form a stressor therein. No implantation mask is required to form the stressor. Lattice constants in the region of the stressor and the region adjacent to the stressor can be modulated depending on the size, location, and doped concentration of the stressor.

According to some aspects of the present disclosure, in a case in which one or more stressors are implemented into a transistor, a channel region of the transistor can be biased by either a compressive stress or a tensile stress, and accordingly, electron mobility or hole mobility can be improved. The transistor can thus operate at a relatively high frequency with relatively lower power consumption.

According to some aspects of the present disclosure, in a case in which a stressor is formed in a substrate, lattice constants of a region of the stressor and a regions adjacent thereto can be modulated such that a lattice mismatch between the substrate and a layer grown thereon can be reduced, allowing direct growth of the layer. Such a layer can be a nanowire which can be implemented to manufacture modern electronics.

According to some aspects of the present disclosure, a semiconductor device includes a semiconductor fin protruding from a substrate, a gate electrode over the semiconductor fin, a gate insulating layer between the semiconductor fin and the gate electrode, source and drain regions disposed on opposite sides of the semiconductor fin, a first stressor formed in a region between the source and drain regions. The first stressor including one material selected from the group consisting of He, Ne, and Ga.

According to some aspects of the present disclosure, a method for manufacturing a semiconductor device includes forming a semiconductor fin on a substrate, forming a first stressor in the substrate by an ion beam, forming a gate insulating layer to cover the semiconductor fin, forming a gate electrode layer to cover the gate insulating layer, and forming source and drain electrodes on opposite sides of the semiconductor fin.

According to some aspects of the present disclosure, a method for forming a nanowire on a semiconductor substrate includes forming a mask layer on the semiconductor substrate, applying ion current on a region of the mask layer, such that ions of the ion current bombard the region of the mask layer to form an opening in the mask layer, and growing a nanowire on a portion of the substrate exposed by the opening of the mask layer. The ions settle in a region in the semiconductor substrate so as to form a stressor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor fin protruding from a substrate;
   a gate structure comparing a gate insulating layer and a gate electrode disposed over the semiconductor fin, wherein the gate insulating layer is disposed between the semiconductor fin and the gate electrode;
   source and drain regions disposed on opposite sides of the gate structure over the semiconductor fin; and
   a first stressor disposed on one side of the semiconductor fin under the gate structure; and
   a second stressor disposed on another side of the semiconductor fin opposite to the first stressor with respect to the semiconductor fin and under the gate structure.

2. The semiconductor device of claim 1, wherein:
   the first stressor comprises of a material selected from the group consisting of He, Ne, and Ga.

3. The semiconductor device of claim 1, wherein:
   the first stressor is disposed in a first region under the gate structure that is adjacent to a region that is under a central region of the semiconductor fin.

4. The semiconductor device of claim 3, wherein:
   the second stressor is disposed in a second region under the gate structure that is adjacent to the region that is under the central region of the semiconductor fin, wherein the second region is opposite of the first region with respect to the semiconductor fin.

5. The semiconductor device of claim 1, wherein:
the substrate is one selected from the group consisting of a Si substrate, a Ge substrate, a SiGe substrate, a GaAs substrate, and an InGaAs substrate.

6. The semiconductor device of claim 1, wherein:
the first and second stressors have a lattice constant that is greater than that of a region of the substrate immediately adjacent and between to the first and second stressors.

7. The semiconductor device of claim 1, wherein:
the first stressor and the second stressor have a concentration of material between $10^{15}$/cm3 to $10^{20}$/cm3.

8. The semiconductor device of claim 1, wherein:
the second stressor comprises of a material selected from the group consisting of He, Ne, and Ga.

9. A semiconductor device, comprising:
a semiconductor fin disposed on a substrate;
a gate structure comparing a gate insulating layer and a gate electrode disposed over the semiconductor fin;
a first stressor disposed on one side of the semiconductor fin under the gate structure; and
a second stressor disposed on another side of the semiconductor fin opposite to the first stressor with respect to the semiconductor fin and under the gate structure.

10. The semiconductor device of claim 9, wherein:
the first stressor and the second stressor have a concentration of material between $10^{10}$/cm3 to $10^{20}$/cm3.

11. The semiconductor device of claim 9, wherein:
the second stressor comprises of a material selected from the group consisting of He, Ne, and Ga.

12. The semiconductor device of claim 9, wherein:
the substrate is one selected from the group consisting of a Si substrate, a Ge substrate, a SiGe substrate, a GaAs substrate, and an InGaAs substrate.

13. The semiconductor device of claim 9, wherein:
the first stressor is disposed in a first region under the gate structure that is adjacent to a region that is under a central region of the semiconductor fin.

14. The semiconductor device of claim 13, wherein:
the second stressor is disposed in a second region under the gate structure that is adjacent to the region that is under the central region of the semiconductor fin, wherein the second region is opposite of the first region with respect to the semiconductor fin.

15. A semiconductor device, comprising:
first and second stressors sequentially disposed in a substrate;
a first gate structure of a first transistor comprising a first gate insulating layer and a first gate electrode disposed over the first stressor;
a second gate structure of a second transistor comprising a second gate insulating layer and a second gate electrode disposed over the second stressor; and
first source and first drain regions of the first transistor disposed on opposite sides of the first gate structure and second source and second drain regions of the second transistor disposed on opposite sides of the second gate structure, wherein the first transistor and the second transistor are N-type transistors, or the first transistor and the second transistor are P-type transistors, wherein the first stressor is disposed between the first source and first drain regions under the first gate structure, and wherein the first stressor has a length of 10 nm along a direction between the first source and first drain regions.

16. The semiconductor device of claim 15, wherein the substrate is one selected from the group consisting of a Si substrate, a Ge substrate, a SiGe substrate, a GaAs substrate, an InGaAs substrate, and a silicon-on-insulator substrate.

17. The semiconductor device of claim 15, wherein the first stressor comprises helium, and wherein the substrate is a (111) silicon.

* * * * *